United States Patent Office 3,110,592

Patented Nov. 12, 1963

3,110,592

METHOD OF MAKING PHOTOGRAPHIC POLYMERIC RESIST IMAGES

Andre K. Schwerin, Binghamton, and Helene D. Evans, Endwell, N.Y., assignors to General Aniline & Film Corporation, New York, N.Y., a corporation of Delaware No Drawing. Filed Oct. 10, 1960, Ser. No. 61,346
12 Claims. (Cl. 96—35)

This invention relates to the production of polymeric resist images wherein an irradiated aromatic diazonium compound or the photodecomposition products thereof is used to inhibit or retard or otherwise prevent polymerization of an ethylenically unsaturated organic compound in the presence of a redox system.

It is recognized that the polymerization of certain polymerizable compounds, i.e., monomeric vinyl compounds, can be initiated by exposure to high intensity radiation such as ultra-violet rays of the type emanating from sunlight or a carbon arc. Thus, it is known that methyl acrylate on long standing in the sunlight, is transformed into a transparent odorless mass of density 1.22, and, in this connection, reference is made to Ellis, "The Chemistry of Synthetic Resins" (vol 2), 1935, p. 1072. It is to be noted, however, that the polymerization by the use of light alone proceeds at a very much slower rate when compared to polymerization brought about by a peroxide catalyst and heat. Moreover, the use of light unaided by other agents tends to produce a low molecular weight polymer.

A particularly useful application of radiant energy to effect polymerization is the formation of photographic resist images. The general procedure comprises coating a suitable base or support with a polymerizable compound such as a monomer or mixture of monomers followed by exposure through a pattern to a high intensity light source. In the exposed areas, the monomer is polymerized to a more or less hard and insoluble mass, whereas the unexposed areas which consist of the original monomer can be readily removed, usually by a simple washing operation. There is left in the exposed areas a resist of insoluble polymer or copolymer. It is likewise known that certain catalysts commonly referred to as photoinitiators are capable of increasing the speed of a photopolymer system. Thus, Minsk et al. in U.S.P. 2,610,120 describe the use of light sensitive polymeric cinnamic acid esters such as polyvinyl cinnamate sensitized with various nitro compounds. According to the one example of this patent, a coating, incorporating these light sensitive polyvinyl cinnamates, required an exposure under a line or half-tone image of 1 minute at a distance of 4 feet from a 35 ampere white flame carbon arc.

Gerhart, in U.S.P. 2,673,151, discloses a light sensitive copolymerizable mixture of (1) polyesters of alpha-beta ethylenic, alpha-beta dicarboxylic acids and (2) ethylenically unsaturated compounds copolymerized therewith, such a composition being sensitized by the addition of sulfur compounds. In this patent, it is suggested that such a composition be exposed by contact or by projection to the desired image, preferably under prolonged exposure until the action of the light has resulted in partial polymerization, i.e., a gel stage, is reached. If desired, the light source may then be removed and the mixture heated until final curing is attained. The light source used was of the high intensity type such as sunlight or light from a carbon arc, i.e., a source rich in ultraviolet radiation.

In a more recent patent, U.S.P. 2,831,768, are described light sensitive polyvinyl arylphenones having increased photographic speed. According to Example I of the patent, which is the only example therein containing photographic data, a coating using a light sensitive aryl ketone required an exposure of 2 minutes at a distance of 10 inches from a sun lamp in order to effect imagewise polymerization.

It should also be noted that the high intensity radiant energy sources employed in the photopolymerization systems described above also produce a large quantity of infrared and heat rays. As a consequence, a certain portion of the monomer or monomers may be polymerized by the action of heat which may interfere with the production of a clean relief image. Thus, if a black and white silver halide negative pattern is used, there should be no polymerized areas under the dark portions of the pattern. However, such dark portions may possibly absorb sufficient radiant heat to effect heat polymerization of the monomer in the light unexposed areas. As a consequence, in those systems where a light source which also has appreciable radiant heat output is used to initiate polymerization of the light sensitive layer under a black and white pattern, clean cut modulation of the polymerization would not be effected.

It is to be noted that in the prior art photopolymer photographic systems as above described, polymerization takes place in the exposed areas, i.e., under the influence of light and a photo-initiator, polymerization takes place with concomitant formation of a polymeric image in the exposed areas. As a result, these systems are said to be negative working; a namely, a negative is obtained from a positive and vice versa. This, of course, requires 2 exposures to be made if one desires to obtain a positive from a positive or a negative from a negative. In many instances, a second exposure is both time consuming and uneconomical and much saving would be effected from the use of a positive working system.

We have now discovered a means of producing photographic polymeric resist images by the use of photosensitive compositions which form positive resist images directly, that is, areas of low intensity exposure or no exposure undergo polymerization with the result that a photographic polymeric resist image is formed in the unexposed area.

The provision of a positive working photographic polymerization system, photosensitive compositions employed therein and a method of making them, constitutes the primary objects and purposes of this invention.

Other objects and purposes will become apparent as the description proceeds.

In accordance with the invention, we produce positive photographic polymeric resist images directly by irradiating a photosensitive layer comprising an ethylenically unsaturated organic compound and a diazonium compound whereby is produced imagewise quantities of photodecomposed diazonium compounds. The so-irradiated layer is next contacted or otherwise treated with a redox system comprising a salt of a divalent metal in its lower oxidation state in the presence of a per compound having the grouping —O—O—. As examples of divalent metals for the aforesaid purpose, mention is made of vanadium, chromium, nickel, iron, etc. In those areas of the layer which were protected from the incident radiation, polymerization takes place. On the other hand, those areas receiving maximum exposure destroy the diazonium compound which inhibits or otherwise prevents polymerization in such areas of the sensitive layer. More particularly, we coat a photographic support such as film base with a mixture of an aromatic light sensitive diazo compound with a vinyl monomer contained in a hydrophilic photographic colloid carrier, such as gelatin. The resulting photographic element is exposed to light of varying intensity. The so-exposed element is treated with a solution of a ferrous compound followed by treatment with aqueous peroxide. Polymerization rapidly takes place in those areas of the coating receiving little or no exposure, whereas in the highly irradiated areas, little or no polymerization is to be noted. The unpolymerized residual monomer can easily be removed by a washing operation, leaving a toughened polymerized resist which has many useful photographic applications.

If desired, the ferrous compound can be incorporated in the photosensitive layer, in which case, development requires only treatment with a peroxide alone. On the other hand, advantages may possibly be had by coating a peroxide in the radiation sensitive layer, in which case, development is then brought about by treatment with a ferrous solution. Various other ramifications and interpretations of the invention will be obvious to those skilled in the photographic art.

We have not as yet ascertained the mechanism which completely accounts for the operation of our invention. In some manner as yet undetermined the irradiated or exposed light sensitive diazonium compound prevents or retards or otherwise inhibits polymerization of the photosensitive composition on treatment with the ferrous salt and the peroxide. At this time, it is not known whether photodecomposition products actually hinder or neutralize the polymerization reaction or whether the explanation is a mechanical one, that is, the evolution of nitrogen by the diazo compound on exposure to radiation might possibly facilitate removal of the coating in the exposed areas. It is to be understood, however, that the aforementioned conjectures as to the mechanism are only speculative and are not intended to limit or in any way restrict the invention.

In general, any iron compound capable of furnishing a ferrous ion is suitable in practicing the invention. Exemplary iron for this purpose include ferrous acetate, ferrous ammonium sulfate, ferrous bromide, ferrous lactate, ferrous nitrate, ferrous oxalate, ferrous perchlorate, ferrous phosphate, ferrous sulfate, ferrous tartrate and the like.

Typical per compounds having the grouping —O—O— useful for practicing the invention are typified by hydrogen peroxide, aliphatic hydroperoxides, i.e., methyl hydroperoxide, ethyl hydroperoxide, t-butyl-hydroperoxide, hexyl hydroperoxide, octyl hydroperoxide, trans-decalin, hydroperoxide, 1-methylcyclopentyl hydroperoxide, 1,1-dimethyl-2-propenyl hydroperoxide, 2-cyclohexene-1-yl hydroperoxide, cumene hydroperoxide, tetralin hydroperoxide, triphenyl methyl hydroperoxide, etc.; peroxides of the formula ROOR′ wherein R and R′, which may or may not be alike, can be alkyl such as methyl, ethyl, propyl, butyl, pentyl, hexyl, octyl, nonyl, decyl, undecyl, etc.; aralkyl, i.e., benzyl, phenethyl, phenylpropyl, naphthyl methyl, naphthylethyl, naphthylpropyl, etc.; aryl such as phenyl, naphthyl, etc.; aliphatic acyl such as acetyl, propionyl, butyryl, valeryl, etc.; aromatic acyl such as benzoyl, naphthoyl, etc.; peroxy acids, i.e., aliphatic peroxy acids, e.g., peracetic acid, perpropionic acid, perbutyric acid, etc.; aromatic peroxy acids, i.e., perbenzoic acid, perphthalic acid, etc.; esters of the aforesaid peroxy acids; salts of peracids such as ammonium persulfate, etc. Such per compounds are well known and their description and preparation can be found in the chemical literature.

In this connection, reference is made to such well-known works as "Organic Peroxides," by Arthur V. Tobolsky and Robert B. Mesrobian, and published by Interscience Publishers, Inc., New York, and Interscience Publishers, Ltd., London (1954).

Any normally liquid to solid photopolymerizable unsaturated organic compound is applicable in the practice of our invention. Preferably, such compounds should be ethylenically unsaturated, i.e., contain at least one non-aromatic double bond between adjacent carbon atoms. Compounds particularly advantageous are the photopolymerizable vinyl or vinylidene compounds containing a $CH_2{=}C<$ group activated by direct attachment to a negative group such as halogen, $>C{=}O$, $-C{\equiv}N$, $-CO-NH_2$, $-C{\equiv}C-$, $-O-$, or aryl. Examples of such photopolymerizable unsaturated organic compounds include acrylamide, acrylonitrile, N-ethanol acrylamide, methacrylic acid, acrylic acid, calcium acrylate, methacrylamide, vinyl acetate, methylmethacrylate, methylacrylate, ethylacrylate, vinyl benzoate, vinyl pyrrolidone, vinylmethyl ether, vinylbutyl ether, vinylisopropyl ether, vinylisobutyl ether, vinylbutyrate, butadiene or mixtures of ethylacrylate with vinyl acetate, acrylonitrile with styrene, butadiene with acrylonitrile and the like.

The above ethylenically unsaturated organic compounds, or monomers as they are sometimes called, may be used either alone or in admixture in order to vary the physical properties such as molecular weight, hardness, etc. of the final polymer. Thus, it is a recognized practice, in order to produce a vinyl polymer of the desired physical properties, to polymerize in the presence of a small amount of an unsaturated compound containing at least two terminal vinyl groups each linked to a carbon atom in a straight chain or in a ring. The function of such compounds is to cross-link the polyvinyl chains. This technique as used in polymerization, is further described by Kropa and Bradley in vol. 31, No. 12, of "Industrial and Engineering Chemistry," 1939. Among such cross-linking agents for the purpose described herein may be mentioned N,N′-methylene-bis-acrylamide, triallyl cyanurate, divinyl benzene, divinyl ketones and diglycol diacrylate. Generally speaking, increasing the quantity of cross-linking agents increases the hardness of the polymer obtained in the range wherein the ratio of monomer to cross-linking agent varies from 10:1 to 50:1. For the purposes of this invention, these cross-linking agents, as exemplified by N,N′-methylene-bis-acrylamide, can be used by themselves without the use of any other vinyl or vinylidene monomers.

The light sensitive diazonium compounds which we have found eminently suitable for carrying out the invention are formed by diazotizing aromatic amines of the type represented in the following list:

4-amino caprylanilide (or 4-caprylamido aniline)
5-stearamido orthanilic acid
5-lauramido anthranilic acid
3-amino-4-methoxydodecanesulfonanilide
4-diethylaminoaniline
2-ethoxy-4-diethylaminoaniline
5-dimethylamino orthanilic acid
4-(di-β-hydroxyethylamino) aniline
4-cyclohexylaminoaniline
4-piperidinoaniline
4-thiomorpholinoaniline
4-hydroxyaniline
3-methyl-4-ethylaminoaniline
4-aminodiphenylamine
3-methyl-4-(β-hydroxyethylamino) aniline
5-amino salicyclic acid
o-Pentadecoxyaniline
N-β-hydroxyethyl-N-ethyl-p-phenylene diamine
Benzidine-2,2′-disulfonic acid
Benzene-2,2′-disulfonic acid
2,5-dichloro-1-amino-benzene
4-chloro-2-amino-1-methylbenzene
4-chloro-2-amino-1-methoxy benzene
2,5-dichloro-1-methyl-4-aminobenzene
3-chloro-1-aminobenzene
2,5-dichloro-1-aminobenzene
2-amino-4-methoxy-5-benzoylamino-1-chlorobenzene
2,5-dichloro-4-amino-1-methylbenzene
4,6-dichloro-2-amino-1-methylbenzene
4-amino-1,3-dimethylbenzene 4,5-dichloro-2-amino-1-methylbenzene
5-nitro-2-amino-1-methylbenzene
5-nitro-2-amino-1-methoxybenzene
3-amino-4-methoxy-6-nitro-1-methylbenzene
3-amino-4-methoxy-6-benzoylamino-1-methylbenzene
6-amino-4-benzoylamino-1,3-dimethoxybenzene
6-amino-4-benzoylamino-1,3-dimethoxy-diphenyl
6-amino-3-benzoylamino-1,4-diethoxybenzene
6-amino-3-benzoylamino-4-ethoxy-1-methoxybenzene
6-amino-3-benzoylamino-1,4-dimethoxybenzene
p-Amino-diphenylamide
p-Phenylenediamine-monosulfo acid
N-β-hydroxyethyl-N-methyl-p-phenylenediamine
N-β-hydroxyethyl-N-ethyl-p-phenylenediamine
p-Ethylamino-m-toluidine
p-Diethylamino-aniline
p-Dimethylamino-aniline
N-benzyl-N-ethyl-p-phenylenediamine
p-Dimethylamino-o-toluidine
p-Diethylamino-o-phenetidine
4-benzoylamino-2,5-diethoxyaniline
2-amino-5-dimethylamino-benzoic acid
N,N-di(β-hydroxyethyl)-p-phenylenediamine
p-(N-ethyl-N-β-hydroxyethylamino)-o-toluidine
p-Di-β-hydroxyethylamino-o-chloroaniline
p-Ethylamino-aniline
p-Phenylenediamine
2,5-diethoxy-4-(4′-ethoxyphenylamino)-aniline
p-4-morpholinylaniline
p-1-pipyridylaniline Other diazonium compounds which are suitable for practicing the invention are described in United States Patents 2,807,545 and 2,772,972.

Diazonium compounds derived from the foregoing primary aromatic amines which are of the benzene and naphthalene series can be employed in the form of their stable diazonium sulfates, chlorobenzene sulfonates or borofluorides or in the form of the double salts of diazonium chloride with zinc chloride, cadmium chloride or stannic chloride.

The diazotization of aromatic amines of the type employed herein is a well known procedure and comprises generally diazotizing the particular amine with sodium nitrite in the presence of an acid.

The photographic polymerization as described herein may be employed in numerous modifications and ramifications. Such a system is particularly applicable to imagewise polymerization, as exemplified in the production of relief printing plates for use in the graphic arts. Such plates can be fabricated by coating a mixture of monomer or monomers in a suitable solvent plus a small quantity of diazonium compound. The resulting layer is then exposed to an optical image whereby the areas not struck by light undergo polymerization when treated in a liquid medium with the above-described redox system. After removal of the unpolymerized monomer in the unexposed areas, a positive polymeric relief image remains firmly bonded to the base material. The resist thus formed can be used as a positive working relief plate. By employing a hydrophilic surface as the support for the light sensitive coating such as, for instance, a partially saponified cellulose acetate, a plate is produced having greasy ink receptive and water receptive areas. In this particular instance, it would be necessary to employ a hydrophobic monomer or a monomer that would give rise to a hydrophobic polymer. Such a plate can then be used as a positive working offset plate for the manufacture of printed copies.

Our invention can be used for a variety of photographic applications as for instance, color reproduction. Thus, a light sensitive plate is prepared as described above, i.e., a base coated with a monomer and a light sensitive diazonium compound, and exposed to one of the primary color aspects of a subject as represented by color separation negative. After treatment with a redox system and removal of the unpolymerized monomer in the exposed areas, the polymerized image so obtained is then subtractively dyed. By exposing other light sensitive plates prepared as above to the remaining primary color aspects of the subject, removal of the unpolymerized monomer in the exposed areas followed by dyeing of the polymerized images with the appropriate subtractively colored dye followed by superposition of the resulting subtractively colored images, a color reproduction of the original subject is thereby obtained.

Other uses to which the above photosensitive coatings may be put include photographic and lithographic applications as, for example, in the production of bimetallic printing plates, edged copper halftone images, printing plates having cellulose ester supports, grained zinc or aluminum lithographic plates, zincated lithographic printing plates, ungrained copper printing plates for preproofing, copper:chromium bimetallic plates, etc.

Various materials are suitable as supports or bases for the radiation sensitive plates prepared in accordance with the process described herein and in this connection reference is made to cellulose ester supports including the hydrophobic variety or the type having a surface made hydrophilic by partial saponification, metals such as aluminum, zinc, brass, copper, stainless steel, terephthalic ester polymers, paper, glass or the like.

A further advantage of our photosensitive coatings and materials arises as a result of their stability so that they the not adversely affected on storage under conditions of excessive humidity and temperature. In this respect, the new materials are superior to the old bichromated glue or albumin layers of the prior art which must be prepared and sensitized just prior to usage because of their poor keeping qualities.

As a source of radiation for producing our photopolymeric images, any convenient source of radiation can be used, i.e., a U.V. lamp, incandescent bulb, carbon arc, etc.

In some instances, it may be desirable to employ in place of gelatin, other hydrophilic colloids of the type commonly used in the photographic art. Suitable colloid carriers for this purpose include polyvinyl alcohol, casein, glue, saponified cellulose acetate, carboxymethyl cellulose, starch and the like.

Various materials are suitable as supports or bases for the photosensitive elements prepared in accordance with the process described herein, and in this connection reference is made to cellulose ester supports including the hydrophobic variety of the type having a surface made hydrophilic by partial saponification, metals, such as aluminum, zinc, brass, copper, stainless steel, terephthalic ester polymers, paper, glass or the like.

The following examples illustrate the invention in greater detail, although such examples are presented by way of illustration only and are not to be construed as limiting the invention.

*Example I*

The following composition was prepared:

| | |
|---|---|
| Gelatin ____g__ | 4 |
| Water ____cc__ | 45 |
| Citric acid____g__ | 1 |
| N,N′-methylene-bis-acrylamide ____g__ | 1 |
| Ferrous ammonium sulfate (1% solution)____cc__ | 3.5 |
| Zinc double salt of diazotized N,N′-hydroxy diethyl p-phenylenediamine ____g__ | 0.4 |

The mixture was coated on a polycarbonate plastic base, and, after drying, was exposed through a photographic positive transparency for 2 minutes at a distance of 12″. In this example, the exposing radiation was the type produced by a Hanovia U.V. lamp. After exposure, the coating was treated for 30 seconds with a 1% aqueous hydrogen peroxide solution which affected rapid polymerization in the unexposed areas. The coating was then bathed with warm water to wash out portions of the coating corresponding to strong exposure. A positive resist was thus obtained which can be dyed or otherwise transformed into an image of high optical opacity. In the event that a black image is desired, an aqueous solution of naphthylamine black can be conveniently employed for this purpose.

*Example II*

The following composition was prepared:

| | | |
|---|---|---|
| Gelatin | g | 4 |
| Water | cc | 40 |
| Citric acid | g | 1 |
| N,N'-methylene-bis-acrylamide | g | 0.5 |
| Zinc chloride salt of diazotized N,N'-β-hydroxy diethyl p-paraphenylenediamine | g | 0.4 |

This mixture was coated on a suitable transparent base such as triacetate photographic base or polycarbonate plastic base and allowed to dry. It was then exposed to a Hanovia U.V. lamp for 1 minute at a distance of 12" using a positive photographic transparency as a pattern. The exposed coating was then treated for 10 seconds with a 1% aqueous ferrous ammonium sulfate solution followed by a 10 second treatment in 1% aqueous hydrogen peroxide. The unpolymerized portions of the coating were rapidly washed out, whereas those parts of the coating corresponding to non-irradiated areas were rapidly polymerized and held fast as a resist image to the support. The so-obtained positive polymeric resist can be dyed or otherwise treated by methods well known in the art.

*Example III*

The same procedure was followed as given in Example II excepting that cumene hydroperoxide was incorporated in the coating composition. This was exposed in the manner previously described and developed by treating with aqueous ferrous ammonium sulfate. The results paralleled those of the earlier example, that is, a tough polymeric resist image was produced in the unexposed areas of coating.

*Example IV*

The procedure of Example II was repeated, excepting that the light sensitive diazo compound was the zinc chloride salt of diazotized p-1-morpholino aniline.

We claim:

1. A method of producing direct positive photographic polymeric resist images which comprises subjecting to a single imagewise exposure with radiant energy in the spectral region of ultra violet to visible light a photographic element coated on a suitable support in the form of a layer comprising an ethylenically unsaturated water soluble monomer containing the terminal grouping CH═C═ which is directly attached to a negative group, a hydrophilic photographic colloidal carrier material and a light-sensitive aromatic diazonium compound in an amount sufficient such that its photodecomposition products resulting from said exposure will be capable of inhibiting the polymerization of said monomer when contacted with a redox system comprising (1) a salt of a divalent material which, in its lower oxidized state, is in the divalent state, and (2) a per compound having the grouping —O—O—; contacting said exposed photographic element with said redox system and a solvent therefor so as to effect polymerization in the unexposed areas only, the polymerization of the exposed areas being inhibited by said decomposition products of the diazonium compound, and thereafter removing the unpolymerized photosensitive composition in the exposed areas to yield a positive resist.

2. A method of producing direct positive photographic polymeric resist images which comprises subjecting to a single imagewise exposure with radiant energy in the ultra violet to visible range a photographic element coated on a suitable support in the form of a layer comprising an ethylenically unsaturated water soluble monomer containing the terminal grouping CH═C═ which is directly attached to a negative group, a hydrophilic photographic colloidal carrier material and a light-sensitive aromatic diazonium compound in an amount sufficient such that its photodecomposition products resulting from said exposure will be capable of inhibiting the polymerization of said monomer when contacted with a redox system comprising a water soluble ferric salt and a per compound having the grouping —O—O—; contacting said exposed photgraphic element with an aqueous solution of said redox system so as to effect polymerization in the unexposed areas only, the polymerization of the exposed areas being inhibited by said decomposition products of the diazonium compound, and thereafter removing the unpolymerized photosensitive composition in the exposed areas by washing to yield a positive resist.

3. A method according to claim 1 wherein the monomer is an acrylamide.

4. A method according to claim 1 wherein said monomer is N,N'-methylene-bis-acrylamide.

5. A method according to claim 1 wherein the photographic colloid carrier material is gelatin.

6. A method according to claim 1 wherein the divalent metal salt is a ferrous ammonium salt.

7. A method according to claim 1 wherein the light-sensitive diazonium compound is the zinc chloride salt of diazotized N-ethyl-N-(β-hydroxyethyl)p-phenylenediamine.

8. A method according to claim 2 wherein said monomer is an acrylamide monomer.

9. A method according to claim 2 wherein said monomer is N,N'-methylene-bis-acrylamide.

10. A method according to claim 2 wherein the photographic colloid carrier material is gelatin.

11. A method according to claim 2 wherein the ferrous salt is ferrous ammonium sulfate.

12. A method according to claim 2 wherein the light-sensitive diazonium compound is the zinc chloride salt of diazotized p-1-morpholinoaniline.

References Cited in the file of this patent

UNITED STATES PATENTS

| | | |
|---|---|---|
| 1,574,357 | Beebe et al. | Feb. 23, 1926 |
| 2,344,785 | Owens | Mar. 21, 1944 |
| 2,875,047 | Oster | Feb. 24, 1959 |
| 2,996,381 | Oster et al. | Aug. 15, 1961 |
| 3,029,145 | Dumers et al. | Apr. 10, 1962 |

FOREIGN PATENTS

| | | |
|---|---|---|
| 1,055,814 | Germany | Apr. 23, 1959 |

OTHER REFERENCES

Cooper: Chemistry and Industry, Apr. 25, 1953, pp. 407–408. (Copy in Sci. Lib.)

Marvel et al.: Journal of the American Chemical Society: (vol. 75, 1953, pp. 384–3848. (Copy in Sci. Lib.)